(12) United States Patent
Cox et al.

(10) Patent No.: US 6,407,694 B1
(45) Date of Patent: Jun. 18, 2002

(54) GENERAL PURPOSE FILTER

(75) Inventors: Lloyd C. Cox, Tucson; Gary A. Gramlich, Oro Valley, both of AZ (US); Robert M. Baker, Simi Valley, CA (US); Stephen Freeman, Tucson, AZ (US); Brian P. Neary, Marcellus, NY (US); Cynthia R. Krzemien, Tucson, AZ (US); Jordan A. Krim, Longmont, CO (US); Luis R. Nunez, Tucson, AZ (US)

(73) Assignee: Raytheon Company, Lexington, MA (US)

( * ) Notice: Subject to any disclaimer, the term of this patent is extended or adjusted under 35 U.S.C. 154(b) by 24 days.

(21) Appl. No.: 09/593,203

(22) Filed: Jun. 14, 2000

(51) Int. Cl.[7] ................................................. H04N 5/21
(52) U.S. Cl. ....................................................... 342/13
(58) Field of Search .................................. 342/195, 194, 342/13; 455/78

(56) References Cited

U.S. PATENT DOCUMENTS 5,625,894 A * 4/1997 Jou .............................. 455/78

* cited by examiner

*Primary Examiner*—Daniel T. Pihulic
(74) *Attorney, Agent, or Firm*—William J. Benman; Colin M. Raufer; Glenn H. Lenzen

(57) ABSTRACT

A versatile signal processor. The inventive signal processor includes a plurality of filters which are selectively interconnected to provide a variety of digital signal processing functions. In the illustrative embodiment, each filter is adapted to multiply input data by a coefficient. Further, each filter includes adders for accumulating the products. The coefficients are provided by an external processor which configures the general purpose filter to a particular function, such as a general purpose filter, a Hilbert filter, a finite impulse response filter, an equalizer, a beamforming network, a convolver, a correlator, or an application specific integrated circuit by way of example. When interconnected in accordance with the teachings provided herein, these circuits may be used to provide a digital receiver.

13 Claims, 7 Drawing Sheets

GENERAL PURPOSE FILTER

A portion of the disclosure of this Patent document contains material which is subject to copyright protection. The copyright owner has no objection to a facsimile reproduction, by any one, of the patent document or the patent disclosure, as it appears in the Patent and Trademark Office patent files or records, but otherwise reserves all copyrights with respect thereto.

BACKGROUND OF THE INVENTION

1. Field of the Invention

The present invention relates to radar receivers. More specifically, the present invention relates to multi-purpose filters used in high performance digital radar receivers.

2. Description of the Related Art

Sophisticated high performance military and commercial digital radar receivers detect and process signals in complicated environments that include broadband clutter, interference sources (intentional and unintentional), echoes, and receiver noise. These receivers perform some or all of the following functions: synthesize in-phase (I) and quadrature (Q) components from high-speed sampled signals, form video filters, notch DC components, decimate data, provide channel-to-channel equalization, perform digital range correlation, and provide interference cancellation.

Currently, these tasks are performed by Hilbert filters, digital video filters, equalization filters, discrete Fourier transform, filters, decimating filters, convolvers, correlators, and general purpose cascadable FIR filters implemented in commercial off-the-shelf hardware (COTS) and customized hardware in embedded systems.

Unfortunately, digital radar receivers implemented in accordance with conventional teachings often require several hundred signal processing chips. As a result, conventional digital radar receivers are typically heavy, bulky, and expensive to develop and manufacture. In addition, these receivers typically consume considerable power and generate much heat.

Hence, there is a need in the art for a unique receiver architecture that is highly flexible, scalable, and reconfigurable that can perform the numerous functions mentioned above. Also, during real time embedded applications, the architecture should be continually reconfigurable to quickly, easily and inexpensively handle changing requirements.

SUMMARY OF THE INVENTION

The need in the art is addressed by the signal processor of the present invention. Generally, the inventive signal processor includes a plurality of filters which are selectively interconnected to provide a variety of digital signal processing functions. In the illustrative embodiment, each filter is adapted to multiply input data by a coefficient. Specifically, each filter includes circuitry to multiply input data by coefficients to form digital filtering products and adders to accumulators the sum of the products. The coefficients are provided by a microprocessor to configure the logic to a particular function, such as a general purpose filter, a Hilbert filter, a finite impulse response filter, an equalizer, a beamforming network, a convolver, a correlator, or an application specific integrated circuit by way of example. When interconnected in accordance with the teachings provided herein, these circuits may be used to provide a digital receiver.

That is, a digital receiver, constructed in accordance with the present teachings would comprise a plurality of general purpose filters constructed in accordance with the present teachings. Each filter would have a plurality of filter banks, switching circuitry to interconnect the filter banks, and programmability provided by an external processor. The processor configures the filter banks, to provide a delay element, a first decimating filter and a first equalizer in a first channel of a first general purpose filter and a Hilbert transform, a second decimating filter and a second equalizer in a second channel of the first general purpose filter. A first range correlator is provided in a first channel of a second general purpose filter and a second range correlator is provided in a second channel of a second general purpose filter. The first channel of the first general purpose filter is connected to the first channel of the second general purpose filter and the second channel of the first general purpose filter is connected to the second channel of the second general purpose filter.

An external processor programs the general purpose filter to configure the filter banks to simultaneously provide the functions found in most digital receivers (Hilbert transforms, video filters, equalizers, range correlation, and general purpose video filters).

The versatile, flexible and reusable features of the inventive general purpose filter architecture allows analog and digital receivers to be built using a single chip type. Accordingly, the receivers are much smaller and lighter in weight than conventional systems and have lower associated power dissipation, thermal heating, and development and manufacturing cost.

DESCRIPTION OF THE INVENTION

Illustrative embodiments and exemplary applications will now be described with reference to the accompanying drawings to disclose the advantageous teachings of the present invention.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope thereof and additional fields in which the present invention would be of significant utility.

Figure 1:
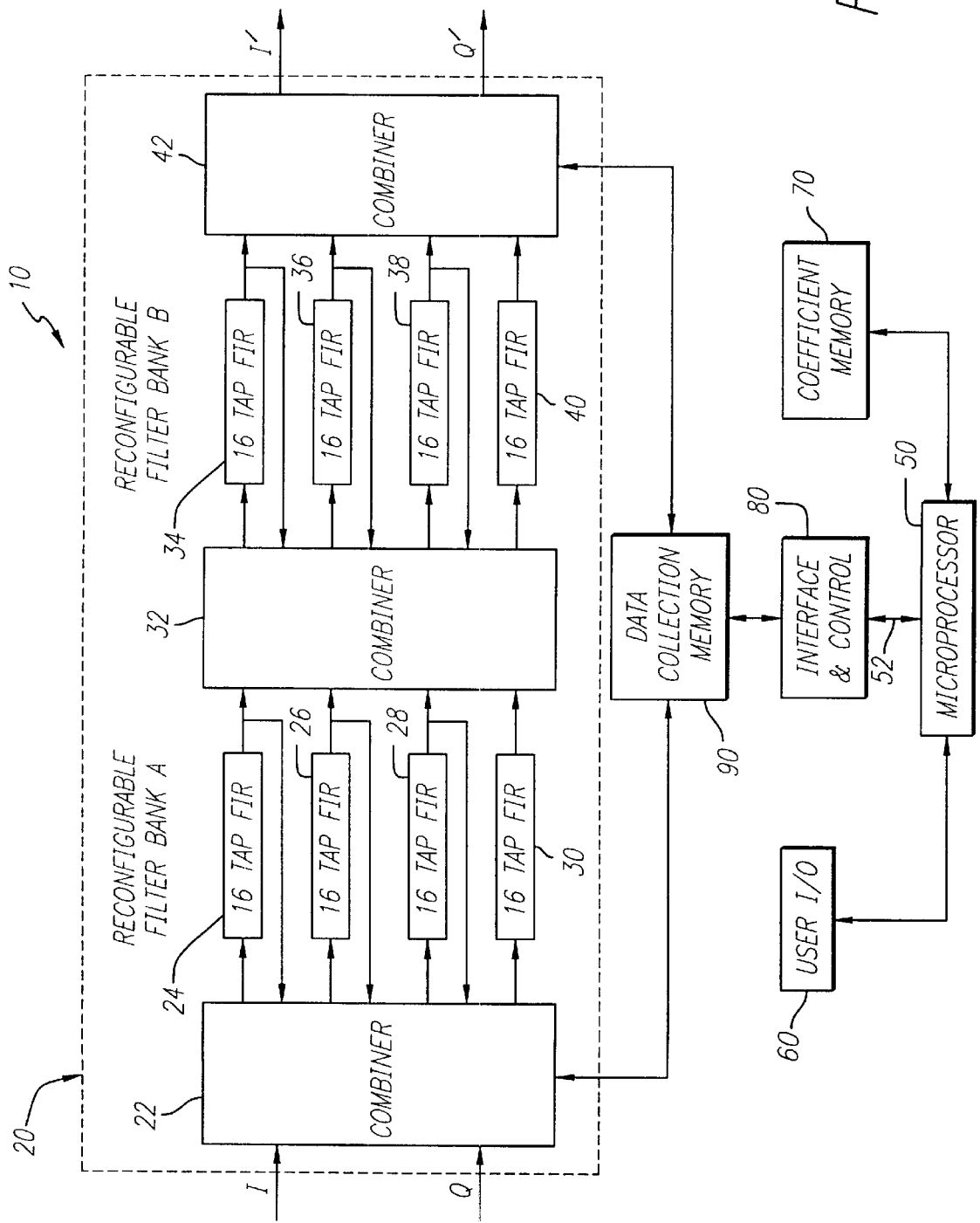
FIG. 1 is a block diagram of the general purpose filter of the present invention along with associated control circuitry.

FIG. 1 is a block diagram of the general purpose filter of the present invention along with associated control circuitry. The system 10 consists of the general purpose filter 20, a microprocessor 50, a user interface 60, a coefficient memory 70, an interface and control circuit 80, and a data collection memory 90. The filter 20 includes first, second and third combiners 22, 32 and 42 which allow the microprocessor 50 to selectively interconnect a plurality of 16 tap finite impulse response (FIR) filters 24–30 and 34–40 (even numbers only) therebetween via a bus (not shown). Tap filters 24–30 provide a first filter bank A between the first and second combiners 22 and 32, respectively. Tap filters 34–42 provide a second filter bank B between the second and third combiners 32 and 42, respectively. Note that the outputs of the first three filters in each bank are fed back to the inputs thereof. Those skilled in the art will recognize that the teachings of the present invention are not limited to FIR filter implementations. The present teachings may be implemented with infinite impulse response (IIR) filters as well.

A user selects a function to be implemented via a user interface 60. As discussed more fully below and in accordance with the present teachings, in response to the user input, the microprocessor 50 selectively interconnects the tap filters via the combiners as necessary to implement the desired function. Much of the signal processing required to implement digital radar receivers can be implemented with a plurality of digital filters properly weighted. Accordingly, in the present invention, the filters are interconnected and provided with tap weight coefficients by the microprocessor as necessary for the desired functionality. The coefficients are provided by a coefficient memory 70. In the illustrative embodiment, timing and control is provided by an interface and control circuit 80.

Figure 2:
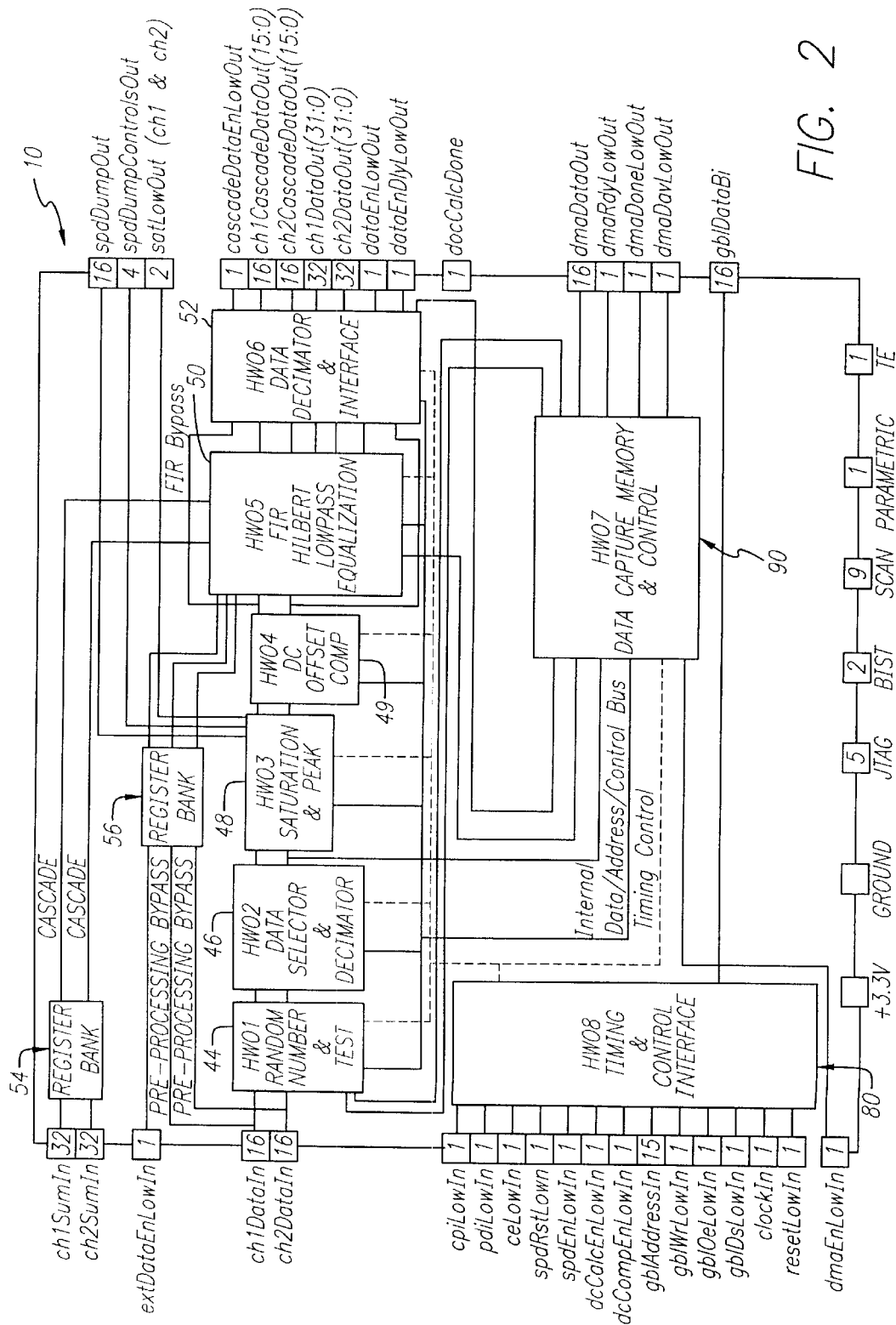
FIG. 2 is a schematic diagram of a portion of the general purpose filter of FIG. 1.

FIG. 2 is a schematic diagram of a portion of the general purpose filter of FIG. 1. In the illustrative embodiment, the system 10 is implemented as a general purpose digital filter (GPF) chip with 128 multiply-add filter cells fabricated in 0.35 micron CMOS technology. Using current technology and the present teachings, the chip 10 may be designed by one of ordinary skill in the art, to operate at rates up to 60 MHz with an asynchronous master reset. In the preferred embodiment, the chip 10 has two 16 bit input channels, two 32 bit output channels, a chip enable and a microprocessor interface.

In the illustrative embodiment, two input ports I and Q allow 128 filter cells to be shared between two data paths. This allows the input data to processed as two separate pieces of data or as complex data. Each path may be configured as a 16 tap arbitrary phase filter, a 32 tap filter or a 128 tap single channel filter. As discussed below, coefficient double buffering and clock synchronization logic permits the user to switch between coefficient sets without causing any undesirable effects in the filter's operation.

A microprocessor compatible bus 52, (consisting of a 16 input address bus, a 16 bit bi-directional data bus, a read/write bit, and a control select), is connected to each element in the system 10 and provides read/write access to programmable internal registers therein. As discussed below, these internal registers are double buffered (see FIG. 5) to allow the chip to switch to new settings upon receipt of an external sync pulse. Consequently, a one clock update cycle is required to update the new settings.

The system 10 is partitioned into 8 functional blocks: a Random Number Generator (RNG) 44, a Data Selector & Interface (DSI) 46, a Saturation & Peak Detector (SPD) 48, a DC Offset Compensation (DOC) 49, a Finite Impulse Response filter (FIR) 50, a Data Decimator & Interface (DCI) 52, a Timing & Control Interface (TCI) 80, and a Data Capture Memory (DCM) 90. Each of these elements is of conventional design.

Banks of registers 54 and 56 are disposed along the data path in order to insure proper alignment of input data, sum data and data enable signals. In addition, the General Purpose Filter Chips may be "chained" together to create a larger multi-tap FIR without requiring additional external buffering.

The RNG 44 is a programmable pseudo-random number generator that allows for a known sequence of numbers to be inserted into the front-end of the data path for self-test purposes. The data sequence for each of the channels is based on the mode and seed values programmed into the number generator. The RNG 44 allows for 12, 14 or 16 bit operation and the data output can either be a constant value, a pseudo random pattern, DCM data or input data.

The DSI 46 is a programmable module that provides data selection and decimation. It provides odd/even data samples and has independent decimation rates for the data path channels and the DCM 90.

The SPD 48 is a general purpose, dual channel, programmable saturation and peak detector. Separate saturation counters, saturation flags, threshold values and peak value data registers are provided for each channel. A saturation occurs when the absolute value of valid channel data is greater than that channel's programmed threshold value. The peak data, over the specified sample period, is determined by identifying the maximum squared value of non-saturated channel data. When a channel's peak value is identified, data for both channels is stored in memory.

The DOC 49 allows for a DC offset value to be calculated over a specified number of samples and then, if enabled, have the offset term removed from the input data stream. In the illustrative embodiment, valid data sample sizes for DC offset calculations are powers of 2, ranging from 2 to 256.

Figure 3:
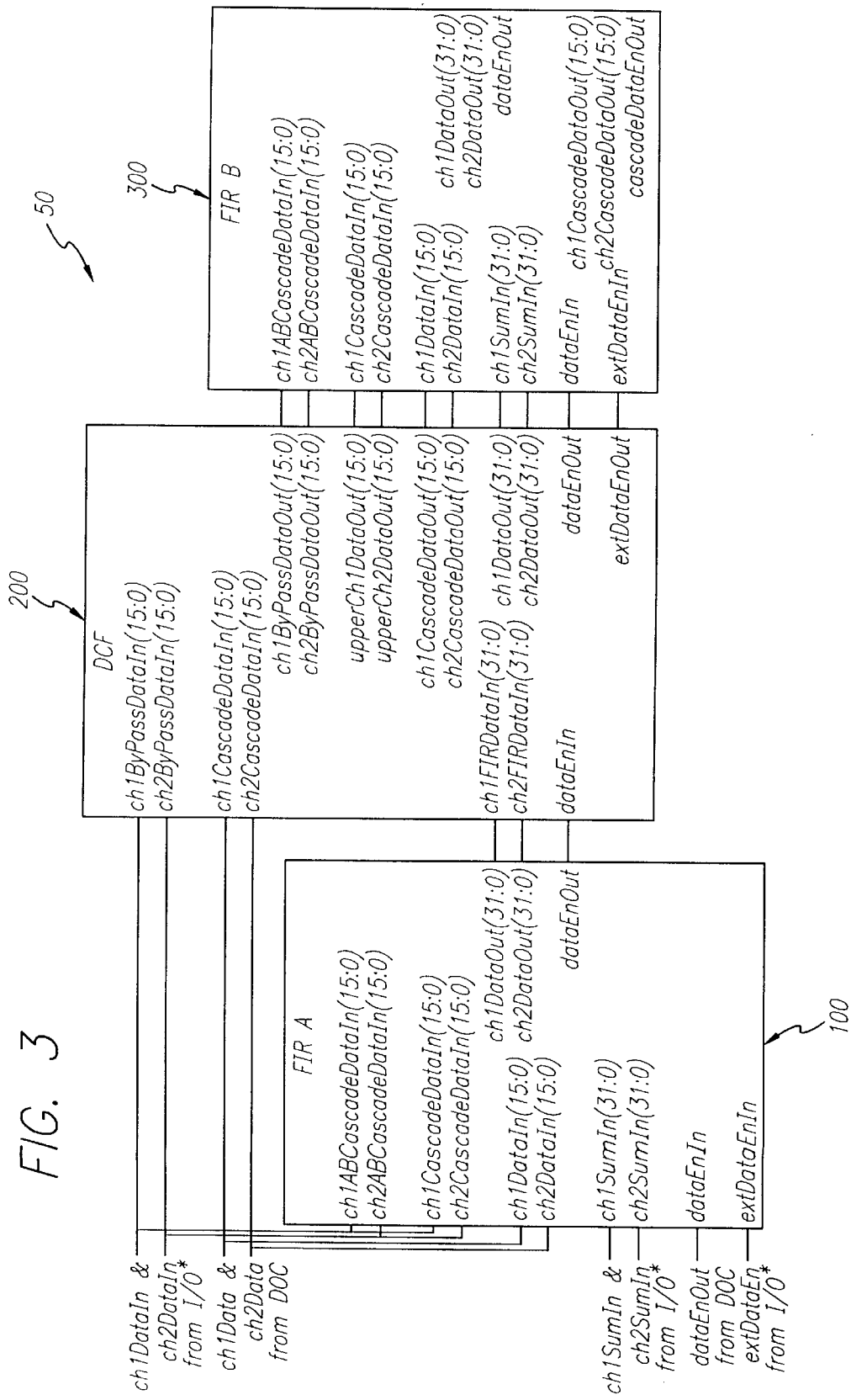
FIG. 3 is a block diagram of the FIR filter utilized in the general purpose filter of the present invention.

FIG. 3 is a block diagram of the FIR filter 50. As illustrated in FIG. 3, the FIR 50 includes the following 3 sub-modules: FIRA 100, DCF 200, and FIRB 300. FIRA and FIRB are identical FIR sub-modules. It is important to note that data from the I/O is pipelined prior to the FIRB block. This is necessary to maintain data alignment along the data path.

Figure 4:
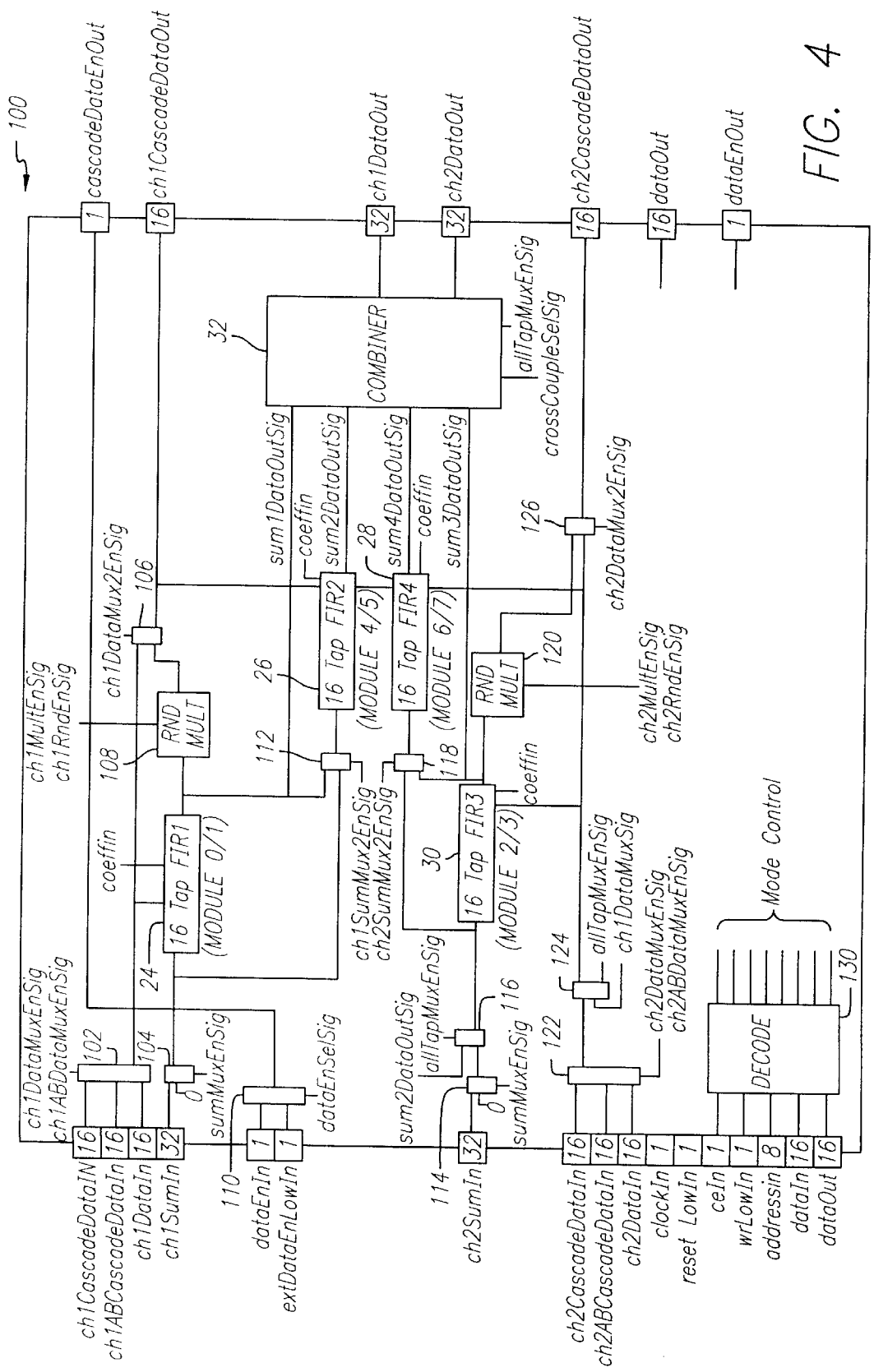
FIG. 4 is a block diagram of an FIR sub-module utilized in the general purpose filter of the present invention.

FIG. 4 is a block diagram of an FIR sub-module 100. Each FIR sub-module 100 is a programmable transposed canonical FIR filter. The sub-module can be configured as a two channel, 16 tap delay Hilbert Transform filter followed by a 16 tap filter, a 32 tap FIR filter, a 64 tap single channel FIR filter, or a 2 channel, 16 tap cross coupled FIR filter. There is a rounding option between the two filters. The type of FIR filter (i.e. low pass, band pass, high pass) is determined by the coefficient values. The programmable coefficients are double buffered to allow the user to switch between coefficients without affecting the filter's operation.

Figure 5:
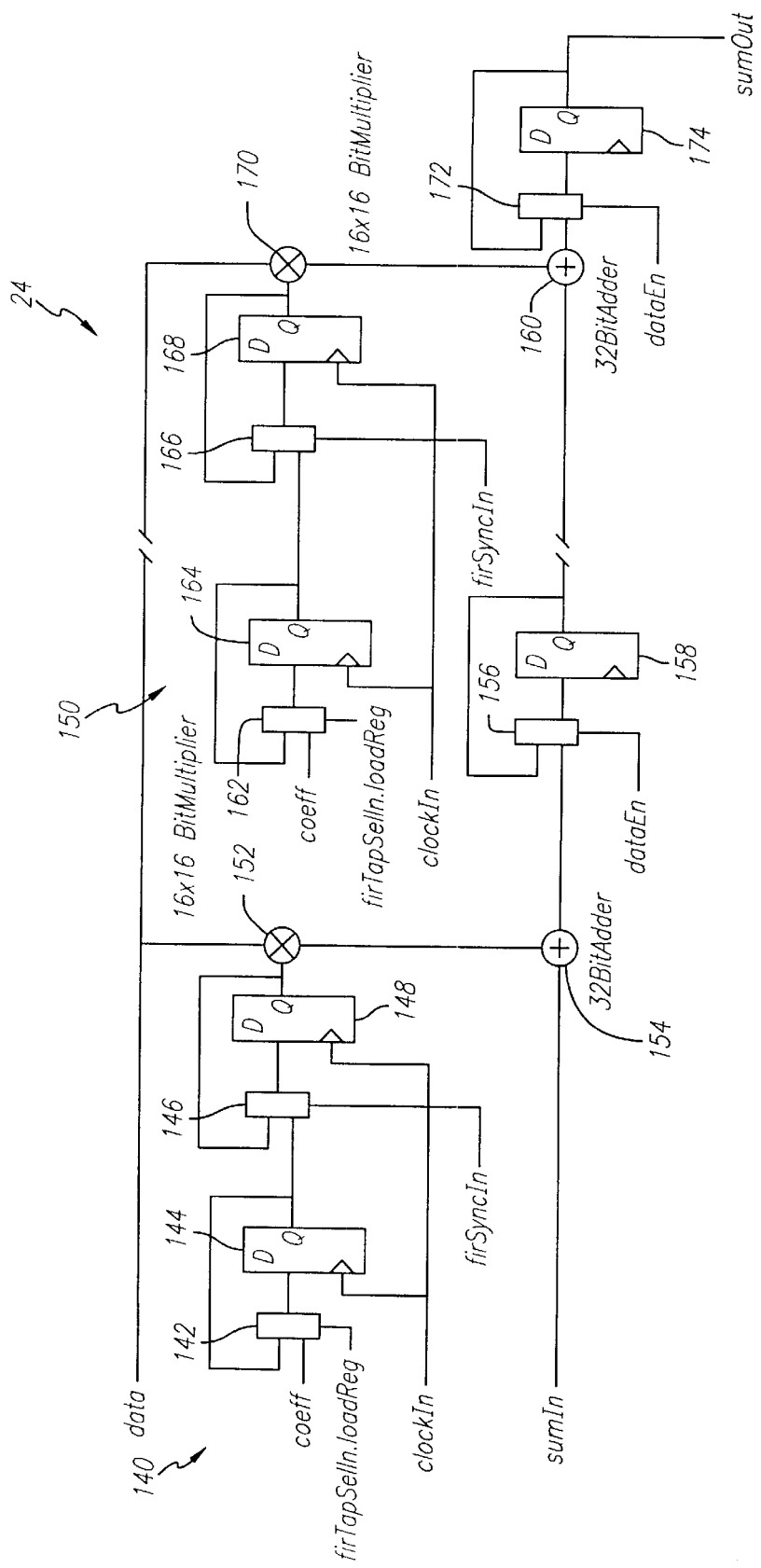
FIG. 5 is a block diagram of an individual FIR filter cell utilized in the general purpose filter of the present invention.

FIG. 5 is a block diagram of an individual 16 tap FIR filter cell 24. It should be noted that FIG. 5 shows only 2 of the filter's 16 taps. The first tap 140 includes a multiplexer 142 having an output connected to the input of a buffer register 144. The input to the multiplexer is a coefficient supplied by the microprocessor 50 of FIG. 1. The. output of a buffer register 144 is connected to an operational register 148. As mentioned above, the double buffering arrangement allows the chip to switch to new settings upon receipt of an external sync pulse. Consequently, a single clock update cycle is required to update the new settings. The output of the operational register 148 is supplied to a multiplier 152 which provides a product of the coefficient input to the buffer register 144 and input data to a summer 154 where it is added to any accumulated sum from previous taps and/or filters. The output of the summer 154 is input to a third register 158 from which it is selectively supplied to a second summer 160 under control of the timing circuit 80. The second summer adds the sum of the product provided by the second tap 150. The second tap 150 is identical to the first tap 140. The output of the second summer 160 is stored in the third register 174 for output.

Returning to FIG. 3, the DCF is a decimator and control for finite impulse response filters. In addition to allowing for data decimation to occur between FIRA and FIRB, the DCF provides decimated FIRA data to the DCM. The decimation rate is programmable and allows for separate rates to be specified for FIRB and the DCM.

Returning to FIG. 2, the DCI 52 is a programmable, dual channel, data decimator that serves as an interface for the FIR 50 to the DCM 90 and external I/O. In non-bypass mode, the input data can be decimated, and presented to the output channel. The decimation rate for data out is independent of the decimation rate for RAM data. In the bypass mode, the data is not decimated and appears at the outputs unmodified. In this mode, the lower 16 bits are set to zero. There is a rounding option available at the data output stage.

The DCM 90 is a programmable memory module that allows input or output data from both channels to be captured. There are three points along the data path where data can be captured. The DSI 46, DCF 200 and DCI 52 all provide the DCM 90 with data. In the illustrative embodiment, the DCM's memory is configured as two 512×16 RAMs and has a maximum input data rate of 30 MHz. These samples can be read by the microprocessor 50 (FIG. 1). Data can be externally or internally triggered with or without a delay from the trigger to the time data is captured.

The TCI 80 handles the general timing, control, and interface requirements for the GPF. The 4 major functions of the TCI are: a microprocessor interface, data path control, AGC timing control and equalization timing control. In addition to each module's enable and data strobe signals, the TCI allows information to be sent over the microprocessor compatible bus. The bus has a 16 bit data I/O port, a 16 bit address port, a read/write bit, and a control select strobe. The control registers, coefficient registers, and DCM RAM are memory mapped into the 16 bit address space.

On chip diagnostic circuits are provided to simplify system debug and maintenance. The GPF has IEEE 1149.1 compliant boundary scan for board level test, scan for internal fault isolation, and Built-In Self Test (BIST) for internal memory verification. The boundary scan interface allows shifting of test data to and from the chips on a board for testing the integrity of the I/O. Scan circuitry provides access and visibility to internal registers, allowing for easy testing of combinatorial logic and checking register integrity. BIST verifies internal memory by writing and reading various patterns.

Signal Descriptions and Memory Map:

In the illustrative embodiment, the address bus is 16 bits wide and is partitioned as follows: the 4 MSBs make up the base address which identifies a particular GPF functional block, 1 bit is for growth and the 10 LSBs are for local addressing. An illustrative description of the input and output signals is shown in Table 1. (Note: The signal description provided in Table 1 is copyrighted by the present assignee and provided for the purpose of illustration only. A copying or creation of a derivative work from the signal description in Table 1 without the prior express written permission of the present assignee is expressly prohibited under U.S. and International Copyright Laws.)

An illustrative memory map is shown in Table 2. (Note: The memory map provided in Table 2 is copyrighted by the present assignee and provided for the purpose of illustration only. A copying or creation of a derivative work from the memory map in Table 2 without the prior express written permission of the present assignee is expressly prohibited under U.S. and International Copyright Laws.)

Figure 6:
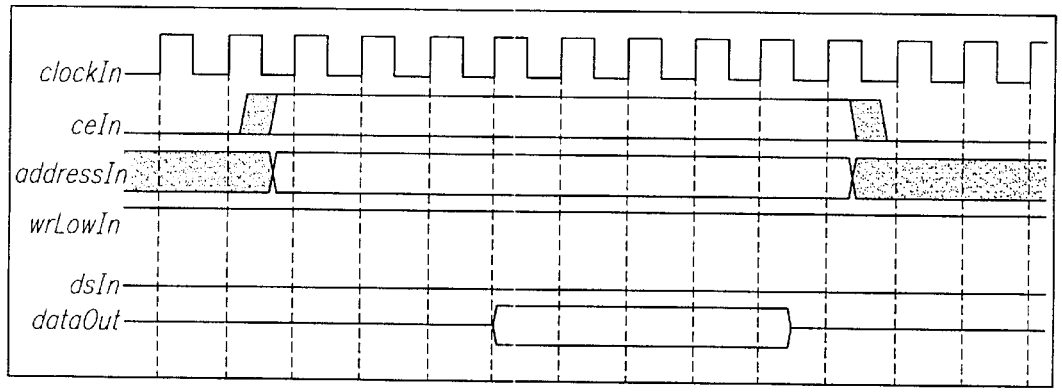
FIG. 6 is an illustrative functional timing for a microprocessor read operation from the general purpose filter of the present invention.

Functional Timing:

Illustrative functional timing for a microprocessor read operation from the GPF is shown in FIG. 6. The enable signal ceIn indicates the beginning of a processor read/write cycle. After the address bus addressIn and wrLowIIn are decoded, data from the memory location is put onto the data bus dataBi during the period when ceIn is active.

Figure 7:
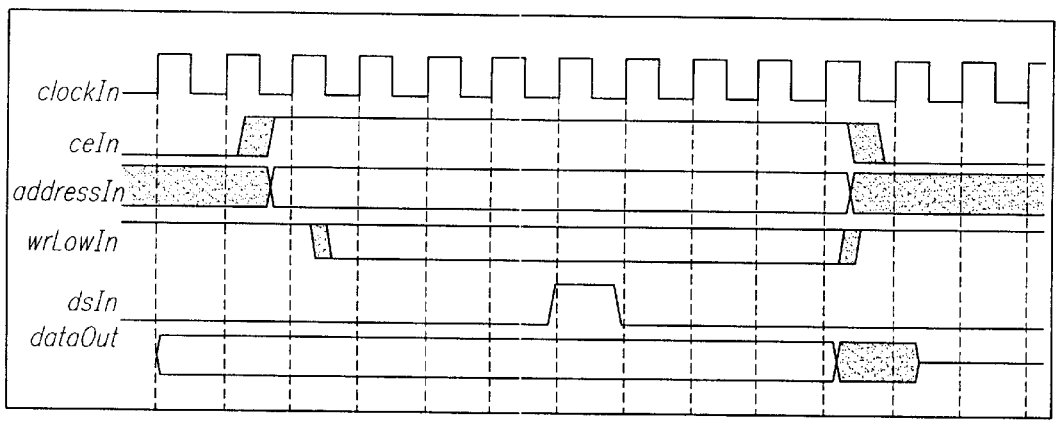
FIG. 7 is an illustrative functional timing for a microprocessor write operation to the general purpose filter of the present invention.

Illustrative functional timing for a microprocessor write operation to the GPF is shown in FIG. 7. The enable signal ceIn indicates the beginning of a processor read/write cycle. After the address bus addressIn and wrLowIn are decoded, the location is written to on the rising edge of clockIn during the period when dsIn is active.

Figure 8:
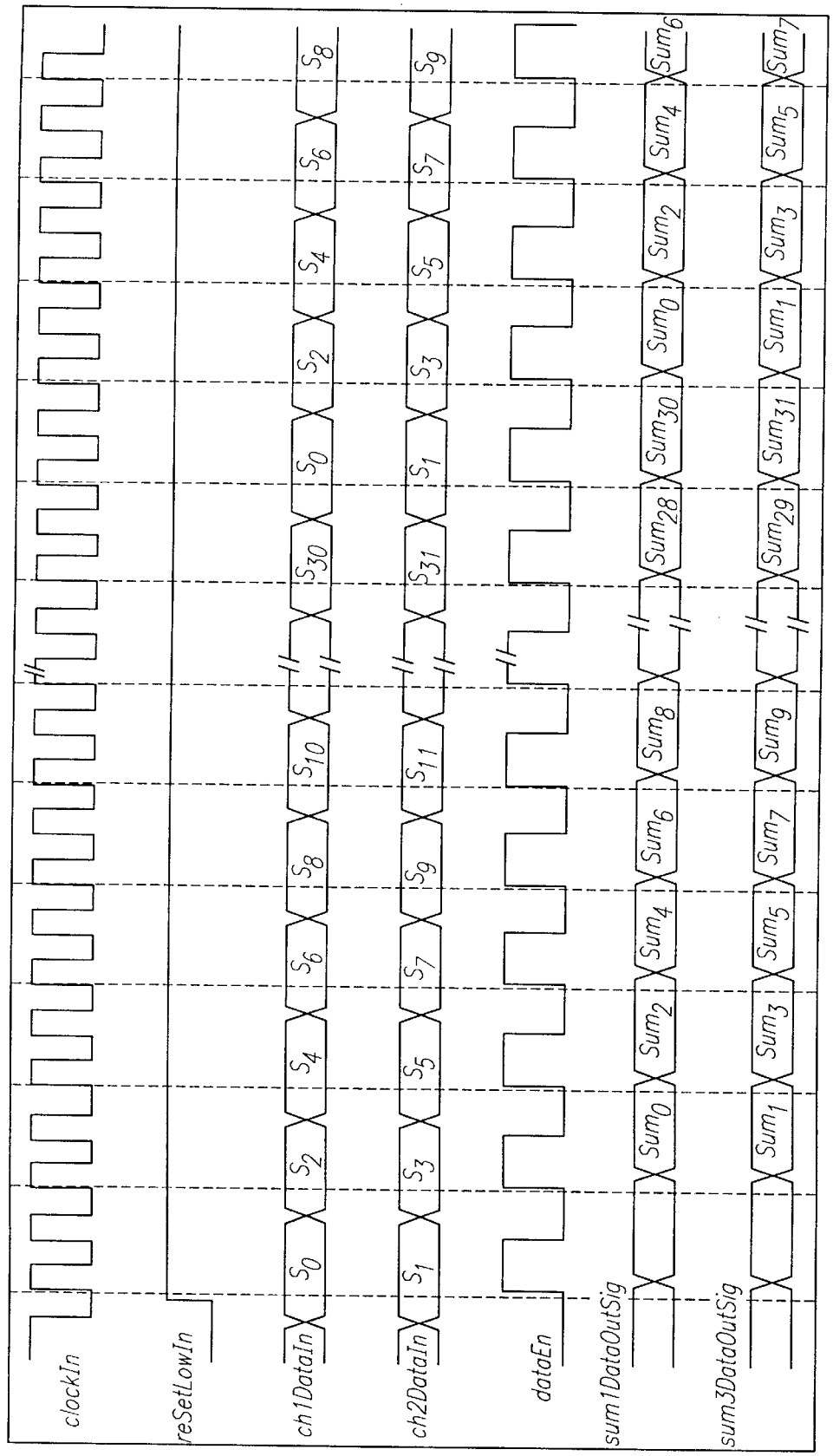
FIG. 8 is an illustrative functional timing diagram for the Hilbert Transform Mode of the general purpose filter of the present invention.

Illustrative functional timing for the Hilbert Transform Mode is shown in FIG. 8.

Thus, the present invention has been described herein with reference to a particular embodiment for a particular application. Those having ordinary skill in the art and access to the present teachings will recognize additional modifications applications and embodiments within the scope thereof.

It is therefore intended by the appended claims to cover any and all such applications, modifications and embodiments within the scope of the present invention.

TABLE 1

Signal I/O Description

| PIN NAME | SIZE | TYPE | FUNCTION |
| --- | --- | --- | --- |
| ch1SumIn(31:0) | 32 | Input | Input sum for channel 1 |
| ch2SumIn(31:0) | 32 | Input | Input sum for channel 2 |
| ch1DataIn(15:0) | 16 | Input | Input data for channel 1 |
| ch2DataIn(15:0) | 16 | Input | Input data tor channel 2 |
| dataEnLowIn | 1 | Input | ch1, ch2 data input rate strobe (from DOC) |
| ExtDataEnLowIn | 1 | Input | ch1, ch2 data input rate strobe (from I/O) |
| outputEnLowIn | 1 | Input | Chip output enable |
| dmaEnLowIn | 1 | Input | Enables the Data Capture RAM Memory |
| cpiLowIn | 1 | Input | Coherent processing interval input |
| pdiLowIn | 1 | Input | Pulse detection interval |
| ceLowIn | 1 | Input | Chip Enable |
| spdEnLowIn | 1 | Input | Disable Saturation & Peak Detection |
| spdDumpLowIn | 1 | Input | Dump data from Saturation & Peak Detection |
| dcCompEnLowIn | 1 | Input | Enable dc compensation |
| dcCalcEnLowIn | 1 | Input | Enable dc offset calculation |
| gblAddressIn | 16 | Input | Global address from external processor |
| gblwrLowIn | 1 | Input | Global bus read/write strobe |
| gbloeLowIn | 1 | Input | Global bus output enable |
| gblDsLowIn | 1 | Input | Global data strobe |
| gblCeLowIn | 1 | Input | Global chip select strobe |
| resetLowIn | 1 | Input | Power up reset for asic |
| clockIn | 1 | Input | 60 MHz clock |

TABLE 1-continued

Signal I/O Description

| PIN NAME | SIZE | TYPE | FUNCTION |
|---|---|---|---|
| testEnIn | 1 | Input | Test - LSI Logic required for setting bi-directionals to inputs and tri-states off |
| tdiIn | 1 | Input | Test - boundary scan data input |
| tmsIn | 1 | Input | Test - boundary scan mode select |
| tckIn | 1 | Input | Test - boundary scan clock |
| trstIn | 1 | Input | Test - boundary scan asynchronous reset |
| bistModeIn | 2 | Input | Test - enable the memory BIST |
| scanEnIn | 1 | Input | Test - scan mode enable for test |
| scan1In | 1 | Input | Test - scan input #1 |
| scan2In | 1 | Input | Test - scan input #2 |
| scan3In | 1 | Input | Test - scan input #3 |
| scan4In | 1 | Input | Test - scan input #4 |
| procMonEnIn | 1 | Input | Test - Enable the parametric nand tree |
| ch1SatLowOut | 1 | Output | Output indicates saturation |
| ch2SatLowOut | 1 | Output | Output indicates saturation |
| spdDumpOut | 16 | Output | Saturation & peak detection module data dump |
| spdDumpEnLowOut | 1 | Output | Saturation & peak detection module data dump enable |
| spdDumpDoneLowOut | 1 | Output | Saturation & Peak detection module data dump done |
| ch1DataOut(31:0) | 32 | Output | Output sum data tor channel 1 |
| ch2DataOut(31:0) | 32 | Output | Output sum data for channel 2 |
| dataEnLowOut | 1 | Output | Ch1 & ch2 output data valid |
| dataEnLowDlyOut | 1 | Output | Ch1 & ch2 output data valid (program delay) |
| dmaDataOut | 16 | Output | Output capture of data |
| dmaDavLowOut | 1 | Output | Indicates each dma data sample valid |
| dmaRdyLowOut | 1 | Output | Indicates dma capture memory full and ready to clock data out |
| dmaDoneLowOut | 1 | Output | Indicates capture of data complete |
| calcDoneLowOut | 1 | Output | Indicates DOC calculation complete |
| gblRdyLowOut | 1 | Output | Indicates end of read/write cycle |
| tdoOut | 1 | Output | Test - boundary scan output |
| scan1Out | 1 | Output | Test - scan output #1 |
| scan2Out | 1 | Output | Test - scan output #2 |
| scan3Out | 1 | Output | Test - scan output #3 |
| scan4Out | 1 | Output | Test - scan output #4 |
| bistDoneOut | 1 | Output | Test - BIST output done when high |
| bistErrorOut | 1 | Output | Test - BIST error occurs when low |
| procMonOut | 1 | Output | Test - parametric nand tree output |
| tstDcmFsmOut | 5 | Output | Test - DCM state machine |
| tstDocCalcStateOut | 2 | Output | Test - DOC DC offset compensation state machine |
| gblDataBi | 16 | Bidirect | 16 bit bi-directional global data bus to external processor |

TABLE 2

| | | | Memory Map | | | |
|---|---|---|---|---|---|---|
| | | 15-12 bits Base Address | | 11 bits Growth | | 10-0 bits |
| | | Address Field | | | | |
| Base Addr | Offset Addr | Item | Module | Access | Data Size (bits) | Initial Value | Description |
|---|---|---|---|---|---|---|---|
| 0000h | 0h | LFSR modeB | RNG | R/W | 2 | 0h | Determines LFSR & RNG mode (Buffered)<br>0h => Tactical<br>1h => Data from DCM<br>2h => LFSR enabled to count<br>3h => LFSR outputs constant value (seed) |
| | 1h | Seed 1B | RNG | R/W | 16 | 0h | Channel 1 LFSR seed (Buffered) |
| | 2h | Seed 2B | RNG | R/W | 16 | 0h | Channel 2 LFSR seed (Buffered) |
| | 3h | Data WidthB | RNG | R/W | 2 | 2h | Input Dta Width (Buffered)<br>0h => 12 bit input data<br>1h => 14 bit input data<br>2h => 16 bit input data<br>3h => 12 but input data |
| | 4h | LFSR mode | RNG | R | 2 | 0h | Determines LFSR & RNG mode<br>0h => Tactical<br>1h => Data from DCM<br>2h => LFSR enabled to count<br>3h => LFSR outputs constant value (seed) |
| | 5h | Seed 1 | RNG | R | 16 | 0h | Channel 1 LFSR seed |
| | 6h | Seed 2 | RNG | R | 16 | 0h | Channel 2 LFSR seed |
| | 7h | Data Width | RNG | R | 2 | 2h | Input Data Width<br>0h => 12 bit input data |

TABLE 2-continued

| | | | | Memory Map | | | |
|---|---|---|---|---|---|---|---|
| | | 15-12 bits  Base Address | | 11 bits  Growth | | 10-0 bits | |
| | | Address Field | | | | | |
| Base Addr | Offset Addr | Item | Module | Access | Data Size (bits) | Initial Value | Description |
|---|---|---|---|---|---|---|---|
| | | | | | | | 1h => 14 bit input data |
| | | | | | | | 2h => 16 bit input data |
| | | | | | | | 3h => 12 bit input data |
| 1000h | 0h | Data Dec Rate Buf | DSI | R/W | 12 | 1h | Data path decimation rate out DSI block (Buffered) |
| | 1h | RAM Dec Rate Buf | DSI | R/W | 12 | 1h | DCM data decimation rate out or DSI block (Buffered) |
| | 2h | Transform Select Buf | DSI | R/W | 1 | 0h | Data select, Odd/Even or true 2 channel data (Buffered)  0h => Samples from Channels 1 & 2  1h => Odd/even samples from Channel 1 |
| | 3h | Data Dec Rate | DSI | R | 12 | 1h | Data path decimation rate out ot DSI block |
| | 4h | RAM Dec Rate | DSI | R | 12 | 1h | DCM data decimation rate out ot DSI block |
| | 5h | Transform Select | DSI | R | 1 | 0h | Data select. Odd/Even or true 2 channel data  0h => Samples from Channels 1 & 2  1h => Odd/even samples from Channel 1 |
| 2000h | 0h | ThresholdB | SPD | R/W | 16 | 7FFFh | Buffered Threshold Value |
| | 1h | Sat1CountB | SPD | R | 16 | 0h | Buffered Number of Channel 1 Saturated Samples |
| | 2h | Sat2CountB | SPD | R | 16 | 0h | Buffered Number of Channel 2 Saturated Samples |
| | 3h | Pk1Ch1ValB | SPD | R | 16 | 0h | Buffered Channel 1 Peak Value |
| | 4h | Pk1Ch2ValB | SPD | R | 16 | 0h | Buffered Channel 2 Associated Value |
| | 5h | Pk2Ch1ValB | SPD | R | 16 | 0h | Buffered Channel 1 Associated Value |
| | 6h | Pk2Ch2VaBt | SPD | R | 16 | 0h | Buffered Channel 2 Peak Value |
| | 7h | Sat1Count | SPD | R/W | 16 | 0h | Number of Channel 1 Saturated Samples |
| | 8h | Sat2Count | SPD | R/W | 16 | 0h | Number of Channel 2 Saturated Samples |
| | 9h | Pk1Ch1Val | SPD | R/W | 16 | 0h | Channel 1 Peak Value |
| | Ah | Pk1Ch2Val | SPD | R/W | 16 | 0h | Channel 2 Associated Value |
| | Bh | Pk2Ch1Val | SPD | R/W | 16 | 0h | Channel 1 Associated Value |
| | Ch | Pk2Ch2Val | SPD | R/W | 16 | 0h | Channel 2 Peak Value |
| | Dh | Threshold | SPD | R/W | 16 | 7FFFh | Threshold Value |
| 3000h | 0h | Sample Size Buffered | DOC | R/W | 9 | 2h | Buffered DC compensation sample size |
| | 1h | Sample Size | DOC | R | 9 | 2h | DC compensation sample size |
| | 2h | Ch1 Comp | DOC | R | 16 | 0h | Channel 1 DC compensation value |
| | 3h | Ch2 Comp | DOC | R | 16 | 0h | Channel 2 DC compensation value |
| | | | | | | | Bit 13 = sumEnSig: Enables CH1 & Ch2 sum input data.  0h => Disables  1h => Enables  Bit 14 = dataEnSelSig;  0h => Mux selects extDataEnLowIn  1h => Mux selects dataEnLowIn  Bit 15 = allTapMuxEnSig; Allows sum output from FIR2 to be used as sum input to FIR3 and combiner outputs sum data from FIR4 for Ch1 and zeros for Ch2.  0h => Disables  1h => Enabled |
| | 80h | Buf. FIRA Mode Reg 2 | FIRA | R/W | 1 | 0h | Buffered FIRA Control Register 2  Bit 15 = Synchronous FIR clear  0h => Clear disabled  1h => Clear enabled |
| 4000h | 100-107h | Coefficients Mod 0 | FRA | R | 16 | 0h | Module 0 Tap 0–7 coefficients |
| | 108-10Fh | Coefficients Mod 1 | FRA | R | 16 | 0h | Module 1 Tap 0–7 coefficients |
| | 110-117h | Coefficients Mod 2 | FRA | R | 16 | 0h | Module 2 Tap 0–7 coefficients |
| | 118-11Fh | Coefficients Mod 3 | FRA | R | 16 | 0h | Module 3 Tap 0–7 coefficients |
| | 120-127h | Coefficients Mod 4 | FRA | R | 16 | 0h | Module 4 Tap 0–7 coefficients |
| | 128-12Fh | Coefficients Mod 5 | FRA | R | 16 | 0h | Module 5 Tap 0–7 coefficients |
| | 130-137h | Coefficients Mod 6 | FRA | R | 16 | 0h | Module 6 Tap 0–7 coefficients |
| | 138-13Fh | Coefficients Mod 7 | FRA | R | 16 | 0h | Module 7 Tap 0–7 coefficients |
| | 140h | Mode Register 1 | FRA | R | 16 | 0h | Mode 1 Control register  Data Bit 0; Read ch1DataMuxEnRSig  Data Bit 1; Read ch1ABDataMuxEnRSig  Data Bit 2; Read ch2DataMuxEnRSig  Data Bit 3; Read ch2ABDataMuxEnRSig |

TABLE 2-continued

| | | | | | Memory Map | | |
|---|---|---|---|---|---|---|---|
| | | 15-12 bits | | | 11 bits | | 10-0 bits |
| | | Base Address | | | Growth | | |
| | | Address Field | | | Data | | |
| Base Addr | Offset Addr | Item | Module | Access | Size (bits) | Initial Value | Description |
|---|---|---|---|---|---|---|---|
| | | | | | | | Data Bit 4; Read ch1MultEnRSig |
| | | | | | | | Data Bit 5; Read ch2MultEnRSig |
| | | | | | | | Data Bit 6; Read ch1RndEnRSig |
| | | | | | | | Data Bit 7; Read ch2RndEnRSig |
| | | | | | | | Data Bit 8; Read ch1MuxEnRSig |
| | | | | | | | Data Bit 9; Read ch2SumMux2EnRSig |
| | | | | | | | Data Bit 10; Read ch2MuxEnRSig |
| 4000h | 00-07h | Buf Coefficients Mod 1 | FIRA | R/W | 16 | 0h | Buffered Module 0 Tap 0–7 coefficients |
| | 08-0Fh | Buf Coefficients Mod 1 | FIRA | R/W | 16 | 0h | Buffered Module 1 Tap 0–7 coefficients |
| | 10-17h | Buf Coefficients Mod 2 | FIRA | R/W | 16 | 0h | Buffered Module 2 Tap 0–7 coefficients |
| | 18-1Fh | Buf Coefficients Mod 3 | FIRA | R/W | 16 | 0h | Buffered Module 3 Tap 0–7 coefficients |
| | 20-27h | Buf Coefficients Mod 4 | FIRA | R/W | 16 | 0h | Buffered Module 4 Tap 0–7 coefficients |
| | 28-2Fh | Buf Coefficients Mod 5 | FIRA | R/W | 16 | 0h | Buffered Module 5 Tap 0–7 coefficients |
| | 30-37h | Buf Coefficients Mod 6 | FIRA | R/W | 16 | 0h | Buffered Module 6 Tap 0–7 coefficients |
| | 38-3Fh | Buf Coefficients Mod 7 | FIRA | R/W | 16 | 0h | Buffered Module 7 Tap 0–7 coefficients |
| | 40h | Buf FIRA Mode Reg 1 | FIRA | R/W | 16 | 0h | Buffered FIRA Control Register 1 |
| | | | | | | | Bits 1-0 = ch1DataMuxEnSig, |
| | | | | | | | ch1 ABDataMuxEnSig |
| | | | | | | | 0h => Mux selects ch1CascadeDataIn |
| | | | | | | | 1h => Mux selects ch1ABCascadeDatIn |
| | | | | | | | 2h => Mux selects ch1DataIn |
| | | | | | | | 3h => Mux selects zero |
| | | | | | | | Bits 3-2 = ch2DataMuxEnSig |
| | | | | | | | ch2ABDataMuxEnSig |
| | | | | | | | 0h => Mux selects ch2CascadeDataIn |
| | | | | | | | 1h => Mux selects ch2ABCascadeDataIn |
| | | | | | | | 2h => Mux selects ch2DataIn |
| | | | | | | | 3h => Mux selects zero |
| | | | | | | | Bit 4 = ch1MultEnSig; Enables Ch1 phase shifting. |
| | | | | | | | 0h => Disabled |
| | | | | | | | 1h => Enabled |
| | | | | | | | Bit 5 = ch2MultEnSig; Enables Ch2 phase shifting. |
| | | | | | | | 0h => Disabled |
| | | | | | | | 1h => Enabled |
| | | | | | | | Bit 6 = ch1RndEnSig; Enables Ch1 rounding. |
| | | | | | | | 0h => Disabled |
| | | | | | | | 1h => Enabled |
| | | | | | | | Bit 7 = ch2RndEnSig; Enables Ch2 rounding. |
| | | | | | | | 0h => Disabled |
| | | | | | | | 1h => Enabled |
| | | | | | | | Bit 8 = ch1DataMux2EnSig |
| | | | | | | | 0h => Mux selects data from Ch1 Rnd/Mult |
| | | | | | | | 1h => Mux selects data from Ch1 data mux 1 |
| | | | | | | | Bit 9 = ch1 SumMux2EnSig |
| | | | | | | | 0h => Mux selects data from FIR1 sumOut |
| | | | | | | | 1h => Mux selects data from sumMuxEnSig |
| | | | | | | | Bit 10 = ch2DataMux2EnSig |
| | | | | | | | 0h => Mux selects data from Ch2 Rnd/Mult |
| | | | | | | | 1h => Mux selects data from Ch2 data mux 1 |
| | | | | | | | Bit 11 = ch2SumMux2EnSig |
| | | | | | | | 0h => Mux selects data from FIR3 sumOut |
| | | | | | | | 1h => Mux selects data from FIR3 sumIn |
| | | | | | | | Bit 12 = crossCoupleSelSig: Enables cross |
| | | | | | | | coupling of data out of 16 tap FIRs. |
| | | | | | | | 0h => Disabled |
| | | | | | | | 1h => Enabled |
| | | | | | | | Data Bit 11; Read ch2SumMux2EnRSig |
| | | | | | | | Data Bit 12; Read crossCoupledEnRSig |
| | | | | | | | Data Bit 13; Read sumEnRSig |
| | | | | | | | Data Bit 14; Read dataEnSelRSig |
| | | | | | | | Data Bit 15; Read allTapMuxEnRSig |
| | | | | | | | Data Bit 15; allTapMuxEnRSig |
| | 180h | Mode Register 2 | FRA | R | 16 | 0h | Mode 2 Control register |
| | | | | | | | Data Bit 0–14; No function |
| | | | | | | | Data Bit 15 = Read firClr |
| 5000h | 0h | Data Dec Rate Buf | DCI | R/W | 12 | 1h | buffered decimation rate for the output data |
| | 1h | RAM Dec Rate Buf | DCI | R/W | 12 | 1h | buffered decimation rate for the RAM data |
| | 2h | Bypass Mode Buf | DCI | R/W | 1 | 0h | buffered mode select |
| | | | | | | | 0h = non-bypass; Data passed through unchanged |
| | | | | | | | 1h = bypass; Bypass data (16) is passed directly |

TABLE 2-continued

| | | | Memory Map | | | | |
|---|---|---|---|---|---|---|---|
| | | 15-12 bits<br>Base Address | | 11 bits<br>Growth | | 10-0 bits | |
| | | Address Field | | | Data | | |
| Base<br>Addr | Offset<br>Addr | Item | Module | Access | Size<br>(bits) | Initial<br>Value | Description |
| | 3h | Output Data Format Buf | DCI | R/W | 1 | 0h | and concatenated with zeros based on the scale format selected.<br>buffered data format select<br>data not rounded = 0h<br>data rounded to 16 bits = 1h |
| | 4h | RAM Data Format Buf | DCI | R/W | 1 | 0h | buffered RAM data format select<br>data not rounded = 0h<br>data rounded to 16 bits = 1h |
| | 5h | Scale Format Buf | DCI | R/W | 3 | 0h | buffered scale format for output data<br>ouptut is input (round 16) data Bit 31, Bit 30:16 = 0h<br>ouptut is input (round 16) data Bit 31, Bit 29:15 = 1h<br>ouptut is input (round 16) data Bit 31, Bit 28:14 = 2h<br>ouptut is input (round 16) data Bit 31, Bit 27:13 = 3h<br>ouptut is input (round 16) data Bit 31, Bit 26:12 = 4h<br>ouptut is input (round 16) data Bit 31, Bit 25:11 = 5h<br>ouptut is input (round 16) data Bit 31, Bit 24:10 = 6h<br>ouptut is input (round 16) data Bit 31, Bit 23:9 = 7h |
| 5000h | 6h | RAM Scale Format Buf | DCI | R/W | 3 | 0h | buffered scale format for RAM data<br>ouptut is input (round 16) data Bit 31, Bit 30:16 = 0h<br>ouptut is input (round 16) data Bit 31, Bit 29:15 = 1h<br>ouptut is input (round 16) data Bit 31, Bit 28:14 = 2h<br>ouptut is input (round 16) data Bit 31, Bit 27:13 = 3h<br>ouptut is input (round 16) data Bit 31, Bit 26:12 = 4h<br>ouptut is input (round 16) data Bit 31, Bit 25:11 = 5h<br>ouptut is input (round 16) data Bit 31, Bit 24:10 = 6h<br>ouptut is input (round 16) data Bit 31, Bit 23:9 = 7h |
| | 7h | Data Enable Delayed | DCI | R/W | 4 | 1h | buffered data enable delayed<br>0 clock cycle delay from output data enable = 0h<br>1 clock cycle delay from output data enable = 1h<br>2 clock cycle delay from output data enable = 2h<br>3 clock cycle delay from output data enable = 3h<br>4 clock cycle delay from output data enable = 4h<br>5 clock cycle delay from output data enable = 5h<br>6 clock cycle delay from output data enable = 6h<br>7 clock cycle delay from output data enable = 7h |
| | 8h | Data Dec Rate | DCI | R | 12 | 1h | current decimation rate for the output data |
| | 9h | Ram Dec Rate | DCI | R | 12 | 1h | current decimation rate for the RAM data |
| | Ah | Bypass Mode | DCI | R | 1 | 0h | current mode select<br>non-bypass = 0h<br>bypass mode = 1h |
| | Bh | Output Data Format | DCI | R | 1 | 0h | current data format select<br>data not rounded = 0h<br>data rounded to 16 bits = 1h |
| | Ch | Ram Data Format | DCI | R | 1 | 0h | current RAM data format select<br>data not rounded = 0h<br>data rounded to 16 bits = 1 h |
| 5000h | Dh | Scale Format | DCI | R | 3 | 0h | current scale format for Output data<br>output is input (round 16) data Bit 31, Bit 30:16 = 0h<br>output is input (round 16) data Bit 31, Bit 29:15 = 1h<br>output is input (round 16) data Bit 31. Bit 28:14 = 2h<br>output is input (round 16) data Bit 31, Bit 27:13 = 3h<br>output is input (round 16) data Bit 31, Bit 26:12 = 4h<br>output is input (round 16) data Bit 31. Bit 25:11 = 5h<br>output is input (round 16) data Bit 31, Bit 24:10 = 6h<br>output is input (round 16) data Bit 31. Bit 23:9 = 7h |
| | Eh | RAM Scale Format | DCI | R | 3 | 0h | current scale format for RAM data<br>output is input (round 16) data Bit 31, Bit 30:16 = 0h<br>output is input (round 16) data Bit 31, Bit 29:15 = 1h<br>output is input (round 16) data Bit 31, Bit 28:14 = 2h<br>output is input (round 16) data Bit 31. Bit 27:13 = 3h<br>output is input (round 16) data Bit 31, Bit 26:12 = 4h<br>output is input (round 16) data Bit 31. Bit 25:11 = 5h<br>output is input (round 16) data Bit 31, Bit 24:10 = 6h<br>output is input (round 16) data Bit 31, Bit 23:9 = 7h |
| | Fh | Data Enable Delayed | DCI | R | 4 | 1h | current data enable delayed<br>0 clock cycle delay from output data enable = 0h<br>1 clock cycle delay from output data enable = 1h<br>2 clock cycle delay from output data enable = 2h<br>3 clock cycle delay from output data enable = 3h<br>4 clock cycle delay from output data enable = 4h |

TABLE 2-continued

| | | Address Field | | | | | |
|---|---|---|---|---|---|---|---|
| | | | | | Data | | |
| Base | Offset | | | | Size | Initial | |
| Addr | Addr | Item | Module | Access | (bits) | Value | Description |
| | | | | | | | 5 clock cycle delay from output data enable = 5h |
| | | | | | | | 6 clock cycle delay from output data enable = 6h |
| | | | | | | | 7 clock cycle delay from output data enable = 7h |
| 6000h | 000 1FFh | Ch1 Mem | DCM | R/W | 16 | NA | Channel 1 capture memory |
| | 200-3FFh | Ch2 Mem | DCM | R/W | 16 | NA | Channel 2 capture memory |
| | 400h | Buffered Control | DCM | R/W | 16 | 0h | Buffered Data capture control register |
| | | | | | | | Bit 0 = 1 - Capture On Sync |
| | | | | | | | Bit 1 = 1 - Snapshot Burst Out |
| | | | | | | | Bit 2 = 1 - Snapshot Feedback |
| | | | | | | | Bits 4,5 - Capture select 00b = DSI. |
| | | | | | | | 01b = DCI, 10b = DCF |
| | | | | | | | Bit 11 = 1 - Capture Complete |
| | | | | | | | Bit 15 = 1 - Reset (Note: Read back at 0b after you write a 1b) |
| | | | | | | | Bits 3.6.7,8,9.10,13,14 - No function |
| | 401h | Dly_BHi | DCM | R/W | 4 | 0h | Delay Counter Buffered High Byte |
| | 402h | Dly_BLo | DCM | R/W | 16 | 1h | Delay Counter Buffered Low Byte |
| | 404h | Control | DCM | R | 16 | 0h | Data capture control register |
| | | | | | | | Bit 0 = 1 - Capture On Sync |
| | | | | | | | Bit 1 = 1 - Snapshot Burst Out |
| | | | | | | | Bit 2 = 1 - Snapshot Feedback |
| | | | | | | | Bits 4,5 - Capture select 00b = DSI, |
| | | | | | | | 01b = DCI. 10b = DCF |
| | | | | | | | Bit 11 = 1 - Capture Complete |
| | | | | | | | Bit 15 = 1 - Reset (Note: Read back at 0b after you write a 1b) |
| | | | | | | | Bits 3,6,7.8,9,10,13,14 - No function |
| | 405h | Dly_Hi | DCM | R | 4 | 0h | Delay Counter High Byte |
| | 406h | Dly_Lo | DCM | R | 16 | 1h | Delay Counter Low Byte |
| 7000h | 0h | Sync control | TCI | R/W | 16 | 0h | Sync control for all modules |
| | | | | | | | Bit C - Sync Select 0b = CPU 1b = External |
| | | | | | | | Bit 1 = Sync Source 0b = CPI 1b = PDI |
| | | | | | | | Bit 2 = Sync on/off 0b= Off 1b = On |
| | | | | | | | Bit 3 = Sync Mode Change |
| | 1h | SPD control | TCI | R/W | 16 | 0h | Bits 0,1 = SPD Sync Source 00b -NOP, 01b - CPU |
| | | | | | | | 10b - Delay, 11b - External |
| | | | | | | | Bit 8 - CPU Dump Control 0b = Off, 01b = On |
| | | | | | | | Bit 10 - CPU Enable Control 0b = Off, 01b = On |
| | | | | | | | Bit 12 - Armed 0b = Off, 01b = On |
| | | | | | | | Bit 15 - SPD timing reset 0b = Off, 01b = On |
| | | | | | | | Bits 2.3,4,5,6,7.9,11,13,14 No function |
| | 2h | SPD Delay High | TCI | R/W | 4 | 0h | SPD delay counter high byte |
| | 3h | SPD Delay Low | TCI | R/W | 16 | 1h | SPD delay counter low byte |
| | 4h | SPD Enable High | TCI | R/W | 4 | 0h | SPD enable counter high byte |
| | 5h | SPD Enable Low | TCI | R/W | 16 | 1h | SPD enable counter low byte |
| | 6h | DOC control | TCI | R/W | 16 | 0h | Bits 0,1 = DOC Sync Source 00b -NOP, 01b - CPU |
| | | | | | | | lCb - Delay, 1 lb - External |
| | | | | | | | Bit 8 - CPU Dump Control 0b = Off, 01b = On |
| | | | | | | | Bit 10 - CPU Enable Control 0b = Off, 01b = On |
| | | | | | | | Bit 12 - Armed 0b = Off, 01b = On |
| | | | | | | | Bit 15 - SPD timing reset 0b = Off, 01b = On |
| | | | | | | | Bits 2.3,4,5.6,7,9,11,13.14 No function |
| | 7h | DOC Delay High | TCI | R/W | 8 | 0h | DOC delay counter high byte |
| | 8h | DOC Delay Low | TCI | R/W | 16 | 1h | DOC delay counter low byte |
| | 9h | DOC Enable High | TCI | R/W | 8 | 0h | DOC enable counter high byte |
| | Ah | DOC Enable Low | TCI | R/W | 16 | 1h | DOC enable counter low byte |
| 8000h | 0h | Data Dec Rate Buf | DCF | R/W | 12 | 1h | buffered decimation rate for the output data |
| | 1h | Ram Dec Rate Buf | DCF | R/W | 12 | 1h | buffered decimation rate for the RAM data |
| | 2h | Bypass Mode Buf | DCF | R/W | 1 | 0h | buffered bypass mode or data path select |
| | | | | | | | data path = 0h |
| | | | | | | | bypass mode = 1h |
| | 3h | Output Data Format Buf | DCF | R/W | 2 | 0h | buffered data format select |
| | | | | | | | data not rounded = 0h |
| | | | | | | | round to 16 bits = 1h |
| | 4h | Ram Data Format Buf | DCF | R/W | 1 | 0h | buffered RAM data format select |
| | | | | | | | data not rounded = 0h |
| | | | | | | | round to 16 bits = 1h |

TABLE 2-continued

| | | | | | Memory Map | | |
|---|---|---|---|---|---|---|---|
| | | | | 15-12 bits<br>Base Address | 11 bits<br>Growth | 10-0 bits | |
| | | Address Field | | | | | |
| Base<br>Addr | Offset<br>Addr | Item | Module | Access | Data<br>Size<br>(bits) | Initial<br>Value | Description |
| | 5h | Scale Format Buf | DCF | R/W | 3 | 0h | buffered scale format for output data<br>output is input (round 16) data Bit 31, Bit 30:16 = 0h<br>output is input (round 16) data Bit 31, Bit 29:15 = 1h<br>output is input (round 16) data Bit 31, Bit 28:14 = 2h<br>output is input (round 16) data Bit 31, Bit 27:13 = 3h<br>output is input (round 16) data Bit 31, Bit 26:12 = 4h<br>output is input (round 16) data Bit 31, Bit 25:11 = 5h<br>output is input (round 16) data Bit 31, Bit 24:10 = 6h<br>output is input (round 16) data Bit 31, Bit 23:9 = 7h |
| 8000h | 6h | RAM Scale Format Buf | DCF | R/W | 3 | 0h | buffered scale format for RAM data<br>output is input (round 16) data Bit 31, Bit 30:16 = 0h<br>output is input (round 16) data Bit 31, Bit 29:15 = 1h<br>output is input (round 16) data Bit 31, Bit 28:14 = 2h<br>output is input (round 16) data Bit 31, Bit 27:13 = 3h<br>output is input (round 16) data Bit 31, Bit 26:12 = 4h<br>output is input (round 16) data Bit 31, Bit 25:11 = 5h<br>output is input (round 16) data Bit 31, Bit 24:10 = 6h<br>output is input (round 16) data Bit 31, Bit 23:9 = 7h |
| | 8h | Data Dec Rate | DCF | R | 12 | 1h | current decimation rate for the output data |
| | 9h | RAM Dec Rate | DCF | R | 12 | 1h | current decimation rate for the RAM data |
| | Ah | Bypass Mode | DCF | R | 1 | 0h | current bypass mode or data path select<br>data path = 0h<br>bypass mode = 1h |
| | Bh | Output Data Format | DCF | R | 2 | 0h | current data format select<br>data not rounded = 0h<br>round to 16 bits = 1h |
| | Ch | RAM Data Format | DCF | R | 1 | 0h | current RAM data format select<br>data not rounded = 0h<br>round to 16 bits = 1h |
| 8000h | Dh | Scale Format | DCF | R | 3 | 0h | current scale format for output data<br>output is input (round 16) data Bit 31, Bit 30:16 = 0h<br>output is input (round 16) data Bit 31, Bit 29:15 = 1h<br>output is input (round 16) data Bit 31, Bit 28:14 = 2h<br>output is input (round 16) data Bit 31, Bit 27:13 = 3h<br>output is input (round 16) data Bit 31, Bit 26:12 = 4h<br>output is input (round 16) data Bit 31, Bit 25:11 = 5h<br>output is input (round 16) data Bit 31, Bit 24:10 = 6h<br>output is input (round 16) data Bit 31, Bit 23:9 = 7h |
| | Eh | RAM Scale Format | DCF | R | 3 | 0h | current scale format for RAM data<br>output is input (round 16) data Bit 31, Bit 30:16 = 0h<br>output is input (round 16) data Bit 31, Bit 29:15 = 1h<br>output is input (round 16) data Bit 31, Bit 28:14 = 2h<br>output is input (round 16) data Bit 31, Bit 27:13 = 3h<br>output is input (round 16) data Bit 31, Bit 26:12 = 4h<br>output is input (round 16) data Bit 31, Bit 25:11 = 5h<br>output is input (round 16) data Bit 31, Bit 24:10 = 6h<br>output is input (round 16) data Bit 31, Bit 23:9 = 7h |
| 9000h | 00-07h | Buf Coefficients Mod 0 | FRB | R/W | 16 | 0h | Buffered Module 0 Tap 0–7 coefficients |
| | 08-0Fh | Buf Coefficients Mod 1 | FRB | R/W | 16 | 0h | Buffered Module 1 Tap 0–7 coefficients |
| | 10-17h | Buf Coefficients Mod 2 | FRB | R/W | 16 | 0h | Buffered Module 2 Tap 0–7 coefficients |
| | 18-1Fh | Buf Coefficients Mod 3 | FRB | R/W | 16 | 0h | Buffered Module 3 Tap 0–7 coefficients |
| | 20-27h | Buf Coefficients Mod 4 | FRB | R/W | 16 | 0h | Buffered Module 4 Tap 0–7 coefficients |
| | 28-2Fh | Buf Coefficients Mod 5 | FRB | R/W | 16 | 0h | Buffered Module 5 Tap 0–7 coefficients |
| | 30-37h | Buf Coefficients Mod 6 | FRB | R/W | 16 | 0h | Buffered Module 6 Tap 0–7 coefficients |
| | 38-3Fh | Buf Coefficients Mod 7 | FRB | R/W | 16 | 0h | Buffered Module 7 Tap 0–7 coefficients |
| | 40h | Buf Mode Register 1 | FRB | R/W | 16 | 0h | Buffered Mode 1 Control register<br>Data Bit 0 = 1; Enable ch2DataMuxEnRsig<br>Data Bit 1 = 1; Enable ch2ABDataMuxEnRSig<br>Data Bit 2 = 1; Enable ch2DataMuxEnRsig<br>Data Bit 3 = 1; Enable ch2ABDataMuxEnRsig<br>Data Bit 4 = 1; Enable ch1MultEnRSig<br>Data Bit 5 = 1; Enable ch2MultEnRSig<br>Data Bit 6 = 1; Enable ch1RndEnRSig<br>Data Bit 7 = 1; Enable ch2RndEnRsig<br>Data Bit 8 = 1; Enable ch1MuxEnRSig<br>Data Bit 9 = 1; Enable ch1SumMuxEnRSig<br>Data Bit 10 = 1; Enable ch2MuxEnRSig<br>Data Bit 11 = 1; Enable ch2SumMux2EnRSig<br>Data Bit 12 = 1; Enable crossCoupledEnRSig<br>Data Bit 13 = 1; Enable sumEnRSig |

TABLE 2-continued

| | | | | | Memory Map | | |
|---|---|---|---|---|---|---|---|
| | | 15-12 bits<br>Base Address | | | 11 bits<br>Growth | | 10-0 bits |
| | | Address Field | | | | | |
| Base<br>Addr | Offset<br>Addr | Item | Module | Access | Data<br>Size<br>(bits) | Initial<br>Value | Description |
| | | | | | | | Data Bit 14 = 1; Enable dataEnSelRSig<br>Data Bit 15 = 1; Enable allTapMuxEnRSig<br>Data Bit 15 = 1; Enable allTapMuxEnRSig |
| | 80h | Buf. Mode Register 2 | FRB | R/W | 16 | 0h | Buffered Mode 2 Control register<br>Data Bit 0–14: No function<br>Data Bit 15 = 1: Enable firClr |
| 9000h | 100-107h | Coefficients Mod 0 | FRB | R | 16 | 0h | Module 0 Tap 0–7 coefficients |
| | 108-10Fh | Coefficients Mod 1 | FRB | R | 16 | 0h | Module 1 Tap 0–7 coefficients |
| | 110-117h | Coefficients Mod 2 | FRB | R | 16 | 0h | Module 2 Tap 0–7 coefficients |
| | 118-11Fh | Coefficients Mod 3 | FRB | R | 16 | 0h | Module 3 Tap 0–7 coefficients |
| | 120-127h | Coefficients Mod 4 | FRB | R | 16 | 0h | Module 4 Tap 0–7 coefficients |
| | 128-12Fh | Coefficients Mod 5 | FRB | R | 16 | 0h | Module 5 Tap 0–7 coefficients |
| | 130-137h | Coefficients Mod 6 | FRB | R | 16 | 0h | Module 6 Tap 0–7 coefficients |
| | 138-13Fh | Coefficients Mod 7 | FRB | R | 16 | 0h | Module 7 Tap 0–7 coefficients |
| | 140h | Mode Register 1 | FRB | R | 16 | 0h | Mode 1 Control register<br>Data Bit 0; Read ch2DataMuxEnRSig<br>Data BIt 1; Read ch2ABDataMuxEnRSig<br>Data Bit 2; Read ch2DataMuxEnRSig<br>Data Bit 3; Read ch2ABDataMuxEnRSig<br>Data Bit 4; Read ch1MultEnRsig<br>Data Bit 5; Read ch2MultEnRSig<br>Data Bit 6; Read ch1RndEnRSig<br>Data Bit 7; Read ch2RndEnRSig<br>Data Bit 8; Read ch1MuxEnRSig<br>Data Bit 9; Read ch1SumMux2EnRSig<br>Data Bit 10; Read ch2MuxEnRsig<br>Data Bit 11; Read ch2SumMux2EnRSig<br>Data Bit 12; Read crossCoupledEnRSig<br>Data Bit 13; Read sumEnRSig<br>Data Bit 14; Read dataEnSelRSig<br>Data Bit 15; Read allTapMuxEnRSig<br>Data Bit 15; allTapMuxEnRSig |
| | 180h | Mode Register 2 | FRB | R | 16 | 0h | Mode 2 Control register<br>Data Bit 0–14; No function<br>Data Bit 15 = 1; Read firClr |

Accordingly,

What is claimed is:

1. A signal processing system comprising:
   a plurality of filters, each filter including means for multiplying input data by a coefficient;
   switch means for selectively interconnecting the filters; and
   means for selectively activating the switch means.

2. A digital receiver comprising:
   a plurality of general purpose filters, each filter having:
      a plurality of filter banks,
      switch means for selectively interconnecting the filter banks, and
      processor means for selectively activating the switch means, the processor means including a processor and
   means for selectively activating the switch means, through the processor, to configure the filter banks to provide:
      a first decimating filter and a first equalizer in a first channel of a first general purpose filter,
      a Hilbert transform, a second decimating filter and a second equalizer in a second channel of the first general purpose filter,
      a first range correlator in a first channel of a second general purpose filter, and
      a second range correlator in a second channel of a second general purpose filter, the first channel of the first general purpose filter being connected to the first channel of the second general purpose filter and the second channel of the first general purpose filter being connected to the second channel of the second general purpose filter.

3. The invention of claim 1 wherein each filter includes means for multiplying input data by coefficients to provide products.

4. The invention of claim 3 wherein each filter includes means for accumulating the products.

5. The invention of claim 4 wherein the coefficients are provided by a memory.

6. The invention of claim 5 wherein the means for selectively activating the switch means is an external processor.

7. The invention of claim 1 wherein the means for selectively activating the switch means includes means for selectively activating the switch means so that the signal processor functions as a general purpose filter.

8. The invention of claim 1 wherein the means for selectively activating the switch means includes means for selectively activating the switch means so that the signal processor functions as a Hilbert filter.

9. The invention of claim 1 wherein the means for selectively activating the switch means includes means for selectively activating the switch means so that the signal processor functions as a beamforming network.

10. The invention of claim 1 wherein the means for selectively activating the switch means includes means for selectively activating the switch means so that the signal processor functions as an equalizer.

11. The invention of claim 1 wherein the means for selectively activating the switch means includes means for selectively activating the switch means so that the signal processor functions as a finite impulse response filter.

12. The invention of claim 1 wherein the means for selectively activating the switch means includes means for selectively activating the switch means so that the signal processor functions as an application specific integrated circuit.

13. The invention of claim 1 wherein the means for selectively activating the switch means includes means for selectively activating the switch means so that the signal processor functions as a digital receiver.

* * * * *